(12) United States Patent
Kuroda et al.

(10) Patent No.: US 7,360,439 B2
(45) Date of Patent: Apr. 22, 2008

(54) SAMPLE RESISTANCE MEASUREMENT DEVICE

(75) Inventors: Yasuhide Kuroda, Kawasaki (JP); Kenichiro Tsubone, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 86 days.

(21) Appl. No.: 11/496,520

(22) Filed: Aug. 1, 2006

(65) Prior Publication Data

US 2007/0199386 A1  Aug. 30, 2007

(30) Foreign Application Priority Data

Feb. 24, 2006  (JP) ............................. 2006-047735

(51) Int. Cl.
*G01B 7/16* (2006.01)

(52) U.S. Cl. ............................. 73/774; 73/766; 73/775; 73/777; 73/778

(58) Field of Classification Search ................. 73/766, 73/774, 775, 777, 778
See application file for complete search history.

(56) References Cited

U.S. PATENT DOCUMENTS

| | | | | |
|---|---|---|---|---|
| 2,726,546 A | * | 12/1955 | King, Jr. ................... | 73/204.15 |
| 4,373,387 A | * | 2/1983 | Nishimura et al. ....... | 73/204.19 |
| 4,492,123 A | * | 1/1985 | Reich ........................... | 73/755 |
| 4,729,242 A | * | 3/1988 | Reich et al. .................. | 73/755 |
| 4,787,251 A | * | 11/1988 | Kolodjski ..................... | 73/755 |
| 4,872,349 A | * | 10/1989 | Espiritu-Santo ............. | 73/727 |
| 5,693,888 A | | 12/1997 | Enderes et al. | |
| 5,753,815 A | * | 5/1998 | Murata ..................... | 73/204.15 |
| 6,474,172 B1 | * | 11/2002 | Rolff et al. ................... | 73/755 |
| 6,938,493 B2 | * | 9/2005 | Bills et al. .................... | 73/755 |
| 7,249,516 B2 | * | 7/2007 | Borenstein et al. ........... | 73/719 |

FOREIGN PATENT DOCUMENTS

JP          8-507864          8/1996

\* cited by examiner

*Primary Examiner*—Edward Lefkowitz
*Assistant Examiner*—Freddie Kirkland, III
(74) *Attorney, Agent, or Firm*—Kratz, Quintos & Hanson, LLP

(57) ABSTRACT

In a circuit, as the bridge resistance of one side of a Wheatstone bridge circuit, a distortion gauge (fixed reference resistance) of which variation caused by environmental conditions is suppressed and a sample having a resistance component $\Delta R$ varied by the environmental conditions are connected in series. A constant bridge input voltage Ei is applied from a constant-voltage power supply to the Wheatstone bridge circuit, a bridge output voltage Eo corresponding to resistance variation of the sample is input to a dynamic distortion amplifier, and a carrier wave signal of a predetermined frequency is output. A measured resistance computing unit samples peak levels of the carrier wave signal output from the dynamic distortion amplifier so as to detect the bridge output voltage Eo, and calculates the resistance of the sample based on the detected bridge output voltage.

12 Claims, 14 Drawing Sheets

BRIDGE OUTPUT SIGNAL Eo

DYNAMIC DISTORTION AMP
OUTPUT SIGNAL

DYNAMIC DISTORTION AMP
OUTPUT SIGNAL
(ENLARGED)

A/D CONVERTER SAMPLE CLOCK

SAMPLE RESISTANCE MEASUREMENT DEVICE

This application is a priority based on prior application No. JP 2006-047735, filed Feb. 24, 2006, in Japan.

BACKGROUND OF THE INVENTION

1. Field of the Invention

The present invention relates to a sample resistance measurement device for measuring an electrical connection state of a circuit component such as an IC soldered and mounted on a circuit substrate for performing an environmental test such as a vibration test, a shock test, or the like, and particularly relates to a sample resistance measurement device for measuring minute resistance variation of a soldered point of the circuit component caused in an environmental test by utilizing Wheatstone bridge.

2. Description of the Related Arts

Conventionally, in an information processing device such as a computer, circuit components such as a CPU and a memory are mounted on a circuit board by soldering. Moreover, recently, package structures of integrated circuits devised for realizing high-density mounting are also used. As leadless package structures suitable for such high-density mounting of integrated circuits, for example, a ball grid array (Ball Grid Array) and a QFN package (Quad Flat Non-Leaded Package) are known. The ball grid array commonly known as BGA is a package in which leadless terminals composed of solder balls are disposed in a grid pattern at a constant interval on the rear surface of the package which is in contact with a printed board, and the leadless terminals are soldered to the corresponding pattern of the printed board. The leadless terminals are on the rear side of the package and in a narrow space sandwiched by the package and the printed board; therefore, a solder paste for joint is applied in advance on the pattern of the printed board in a printing process, and soldering is performed by heating the entire package and melting the solder for joint applied on the part of the terminals. The QFN package is a package having a structure in which leads are eliminated, and merely electrode pads for soldering are formed, and the electrode pads are positioned on the rear surface of the package. On the other hand, various environmental tests of, for example, a vibration test, a shock test, and thermal shock are performed by environmental test equipment for the circuit boards having circuit components mounted on printed boards by soldering, thereby ensuring reliability and durability thereof when they are shipped as products. In such environmental tests, thermal stress and mechanical stress is repeatedly applied to various connecting parts of the circuit parts mounted on the circuit boards so as to generate distortion therein, and they are mechanically separated and cut when the stress reaches limit, thereby causing temporary interruption in which electrical connection is temporarily disconnected. In the environmental tests, conventionally, at the end of the tests, whether exfoliation, cracks, and the like are generated or not is checked by visually inspecting the soldered parts of the circuit components. However, in the BGAs and QFNs used in recent high-density mounting, the soldered parts cannot be seen from outside, and visual inspection cannot be performed. Therefore, in the environmental tests of the circuit boards in which the soldered parts cannot be seen from outside, resistance measurement has to be performed as a method for measuring the state of electrical connection of the circuit components. In the resistance measurement, a method using a data logger and a method using an oscilloscope of high-speed sampling are known. On the other hand, as a method for measuring distortion, a method in which a Wheatstone bridge and a high-speed amplifier (abbreviated as "dynamic amplifier") for capturing dynamic phenomena are combined is known. This method captures variation in distortion amount as variation in resistance value at high speed.

FIG. 1A is a two-wire type data logger; wherein a sample 104 is connected to cables lead from a resistance meter 100, a constant voltage is fed from the resistance meter 100 to the sample 104, and the flowing current is detected so as to measure the resistance of the sample 104. In the case of the two-wire type data logger, measured resistance includes wiring resistance of the cable 102, and the resistance of the sample 104 cannot be accurately measured.

FIG. 1B is a four-wire type data logger; wherein cables 108 of the four-wire type are lead from a resistance meter 106 and connected to the sample 104, a constant voltage is fed from the resistance meter 106 to the sample 104, and the flowing current is detected so as to measure the resistance of the sample 104. In this case, by virtue of the four-wire type, the measured resistance does not include the wiring resistance of the cables 108, and the resistance of the sample 104 can be accurately measured.

FIG. 2 is an oscilloscope 110 of high-speed sampling; wherein cables 112 connecting the sample 104 are connected to a constant-voltage power supply 114 and connected to a current meter 116 for monitoring in the side of the oscilloscope 110.

FIG. 3A is a dynamic distortion measurement device using a Wheatstone bridge which is comprised of a Wheatstone bridge 118, a dynamic distortion amplifier 120, a distortion gauge 122, a constant-voltage power supply 126, and a dynamic distortion processing device 128. The distortion gauge 122 is connected as one resistance of a bridge side of the Wheatstone bridge 118, all the bridge resistances including the distortion gauge 122 are set to be a same resistance value R in a state in which a bridge input voltage Ei is applied from the constant-voltage power supply 126, and a bridge output voltage Eo with respect to the dynamic distortion amplifier 120 is 0 volt. The distortion gauge 122 is fixed like FIG. 3B on a sample 124 for which a vibration test is to be performed; wherein the resistance value is increased when the sample 124 is upwardly curved and the distortion gauge 122 is stretched, and, inversely, the resistance value is decreased when the sample 124 is downwardly curved and the distortion gauge 122 shrinks. In accordance with such variation of the resistance value of the distortion gauge 122, the bridge output voltage Eo is varied. The bridge output voltage Eo is input to the dynamic distortion amplifier 120, and the amplifier outputs a carrier wave of the current which is changed in accordance with the bridge output voltage Eo and performs high-speed sampling of the voltage variation due to output of the carrier wave by an A/D converter. Therefore, although the signal lines from the Wheatstone bridge 118 to the sample 124 are two lines, the amount of the changed resistance due to vibration of the distortion gauge 122 provided on the sample 124 can be extracted.

However, the stress generated in the connecting part of the sample during an environmental test in which a vibration test, a shock test, or the like is performed is generated as a transient phenomenon, and a response speed for capturing variation of a frequency range of about 10 Hz to 2 KHz is required. Therefore, the measurement sampling speed is required up to 50 Hz to 10 KHz which are about five times the response speed. Both the two-wire type and the four-wire type data loggers have measurement response time of 0.1 second at minimum and a response speed of merely a 10 Hz level; therefore, they are completely deficient in capability. Moreover, in the case of the two-wire type data logger, measured resistance includes the wiring resistance of the cables connecting the resistance meter to the sample, and resistance variation of the sample cannot be measured. Furthermore, in the four-wire type data logger, although measured resistance of the sample does not include wiring resistance, the number of wires is increased. In the oscilloscope of high-speed sampling, constant-current power supplies as many as the number of channels are required, and the scale of the measurement system is increased. Therefore, the number of channels measured at the same time is about four channels at most, and it is not suitable for multi-channel measurement in an environmental test in which 10 or more channels are required. Moreover, when measured data results in distortion/vibration waveforms, the amount of data is increased, thereby causing a problem in long-time recording. On the other hand, the dynamic distortion measurement device using the Wheatstone bridge amplifies minute resistance variation of the distortion gauge at high magnification and, furthermore, is designed for multi-channels. A normal sampling cycle is 10 to 20 KHz, it is capable of long-time recording, and the ability of response is also satisfactory as a recording system. However, the dynamic distortion measurement device using the Wheatstone bridge is a device which extracts the varied amount of the resistance due to vibration from the distortion gauge fixed to a measurement object and converts the resistance varied amount into a distortion physical amount, and involves a problem that the resistance value variation of the sample for which an environmental test or the like is being performed cannot be directly monitored with high sensitivity.

SUMMARY OF THE INVENTION

According to the present invention to provide a sample resistance measurement device which can highly accurately measure a minute resistance value of a sample which varies at a high speed in a vibration test, shock test, or the like by contriving a wiring structure corresponding to sample resistance with respect to a Wheatstone bridge of a dynamic distortion meter.

The present invention provides a sample resistance measurement device. The sample resistance measurement device of the present invention is characterized by having a sample having a resistance component varied by an environmental condition including external force and a temperature;

a fixed reference resistance having a predetermined resistance value of which variation caused by the environmental condition is suppressed;

a Wheatstone bridge circuit connecting a first resistance, a second resistance, a third resistance, and a fourth resistance by bridge connection, and is a circuit connecting the first resistance with the fixed reference resistance and the sample in series, wherein resistance values of the second resistance and the fourth resistance are same as the fixed reference resistance;

a constant-voltage power supply for applying a constant bridge input voltage between a first connection point connecting the first resistance with the fourth resistance and a third connection point connecting the second resistance and the third resistance of the Wheatstone bridge circuit;

a dynamic distortion amplifier circuit for inputting a bridge output voltage from the part between a second connection point connecting the first resistance and the second resistance and a fourth connection point connecting the third resistance and the fourth resistance of the Wheatstone bridge circuit, and outputting a carrier wave signal of a predetermined frequency varied in accordance with the bridge output voltage; and a measured resistance computing unit for detecting the bridge output voltage by sampling a peak level of the carrier wave signal of the dynamic distortion amplifier circuit and calculating resistance of the sample based on the detected bridge output voltage.

The sample has the resistance component which is varied in the environmental test including a vibration test, a shock test, or a thermal shock test. The sample is a circuit component mounted by soldering a plurality of pins to a substrate, and resistance of a circuit in which a plurality of soldered points of the circuit component are connected in series serves as a measurement object.

The sample resistance measurement device of the present invention is characterized in that the fixed reference resistance, the Wheatstone bridge circuit, the constant-voltage supply, the dynamic distortion amplifier, and the measured resistance computing unit are disposed in the side of an environmental test monitoring device, and a measurement probe having two signal lines connected to the sample loaded in the side of an environmental tester is lead from the side of the environmental test monitoring device.

The fixed reference resistance is a distortion gauge having a resistance value same as each of the first to third resistances. The distortion gauge is housed in a container having a heat insulating structure and a sealed structure in a state in which the distortion gauge is fixed to and disposed on a base substrate having an equivalent thermal expansion coefficient.

The fixed reference resistance is comprised of two divided resistors connected in series, and one of the resistors is composed of a first resistance material having a positive temperature coefficient, and the other resistor is composed of a second resistance material having a negative temperature coefficient having an equivalent value. The fixed reference resistance comprised of the two divided resistors connected in series is housed in a container having a sealed structure (without heat-insulating structure) in a state in which it is fixed and disposed on a base substrate having an equivalent thermal expansion coefficient.

The measured resistance computing unit calculates a resistance $\Delta R$ of the sample as $$\Delta R = \frac{4REo}{Ei - 2Eo},$$

when the resistance of the sample is $\Delta R$, each of the fixed reference resistance and the second to fourth resistances of the Wheatstone bridge is R, the bridge input voltage is Ei, and the bridge output voltage is Eo.

When the sample is a circuit component mounted by soldering a plurality of pins to a substrate, and the resistance of the circuit in which a plurality of soldered points of the circuit component are connected in series serves as a measurement object, the measured resistance computing unit calculates a resistance value caused by generating of a crack in the soldered points of the circuit component.

The measured resistance computing unit calculates a variation amount of the sample resistance value caused by the environmental test. The measured resistance computing unit calculates the resistance variation amount of the sample by subtracting a no-load resistance component to the sample from the calculated resistance value of the sample.

According to the present invention, a minute resistance of the sample which serves as a measurement object is assumed as a resistance variation component of a reference fixed resistance connected to one side of a Wheatstone bridge, and the reference fixed resistance is stabilized such that it is not affected by an environmental test by separating and isolating it from external air and external force of the measurement environment; consequently, the bridge output voltage of the Wheatstone bridge can be output in accordance with merely resistance variation of the sample caused by the environmental test, thereby realizing high-speed highly-accurate resistance measurement of directly measuring the minute resistance component of the sample by utilizing the Wheatstone bridge and the dynamic distortion amplifier. Moreover, merely by disposing the dynamic distortion amplifier, the Wheatstone bridge, and the reference fixed resistance separated and isolated from external air and external force in the side of an environmental test monitoring device and leading a two-wire cable as a measurement probe in the side of the sample, multi-channeling can be readily realized, and the number of channels required in resistance measurement of the sample required in the environmental test can be ensured as well as a conventional dynamic distortion meter. Moreover, as the fixed reference resistance, the distortion gauge connected to the Wheatstone bridge used in a conventional dynamic distortion meter is used without modification, and the distortion gauge is shielded from external air and external force; consequently, temperature variation, vibration, and the like are not applied to the distortion gauge, and a noise component caused by variation of the resistance of the distortion gauge is reduced, thereby enabling highly accurate measurement of a minute resistance of, for example, 10 mΩ order. Furthermore, the fixed reference resistance connected on one side of the Wheatstone bridge is divided into a resistor having a positive temperature coefficient and a resistor having a negative temperature coefficient of the same magnitude and connected in series; consequently, even when the temperature of the fixed reference resistance is varied, resistance variation is canceled out such that the resistance value is not varied, a heat-insulating structure as a container for housing the fixed reference resistance becomes unnecessary, and cost can be reduced. The above and other objects, features, and advantages of the present invention will become more apparent from the following detailed description with reference to the drawings.

DETAILED DESCRIPTION OF THE PREFERRED EMBODIMENTS

Figure 1A:
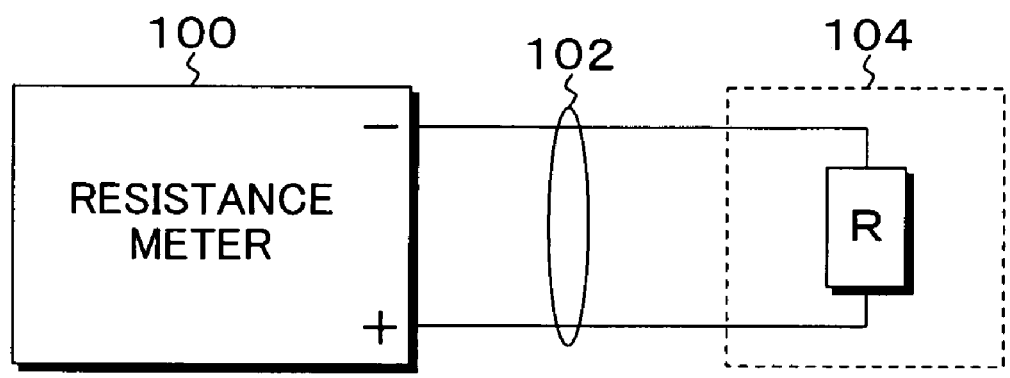
FIGS. 1A and 1B are explanatory diagrams of resistance measurement by means of conventional data loggers.
Figure 1B:
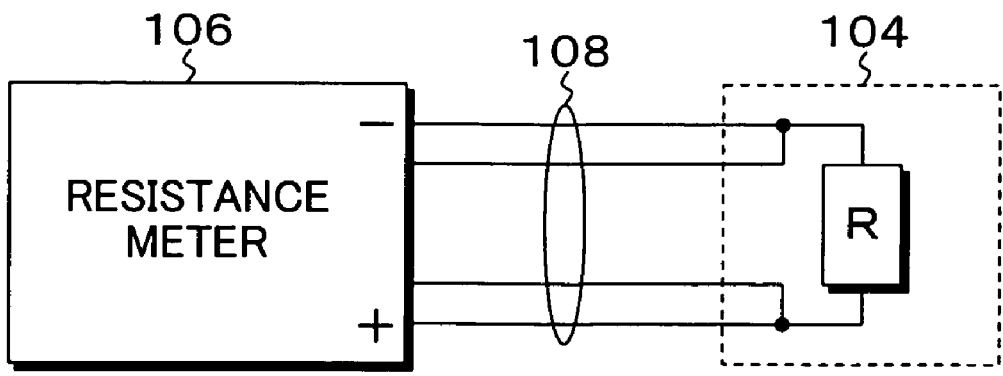
Figure 2:
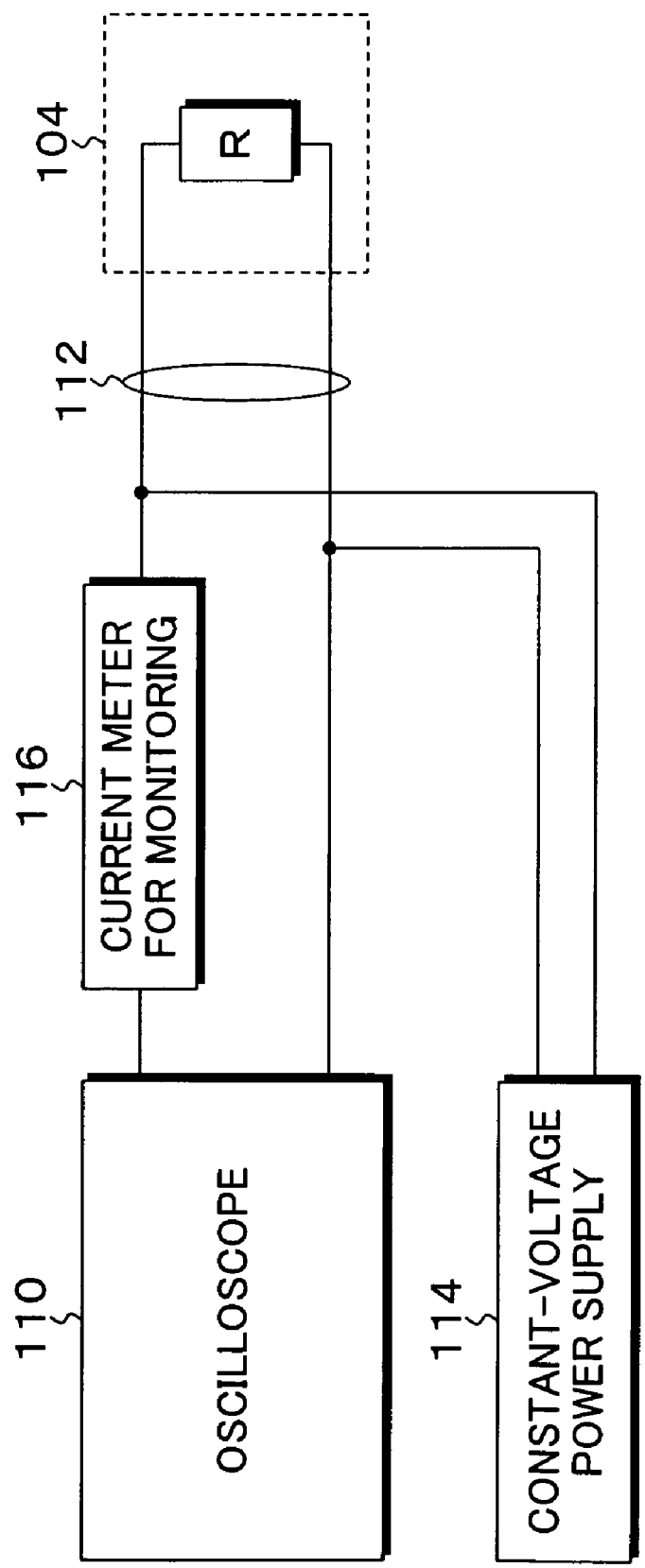
FIG. 2 is an explanatory diagram of resistance measurement of conventional high-speed sampling by means of an oscilloscope.
Figure 3A:
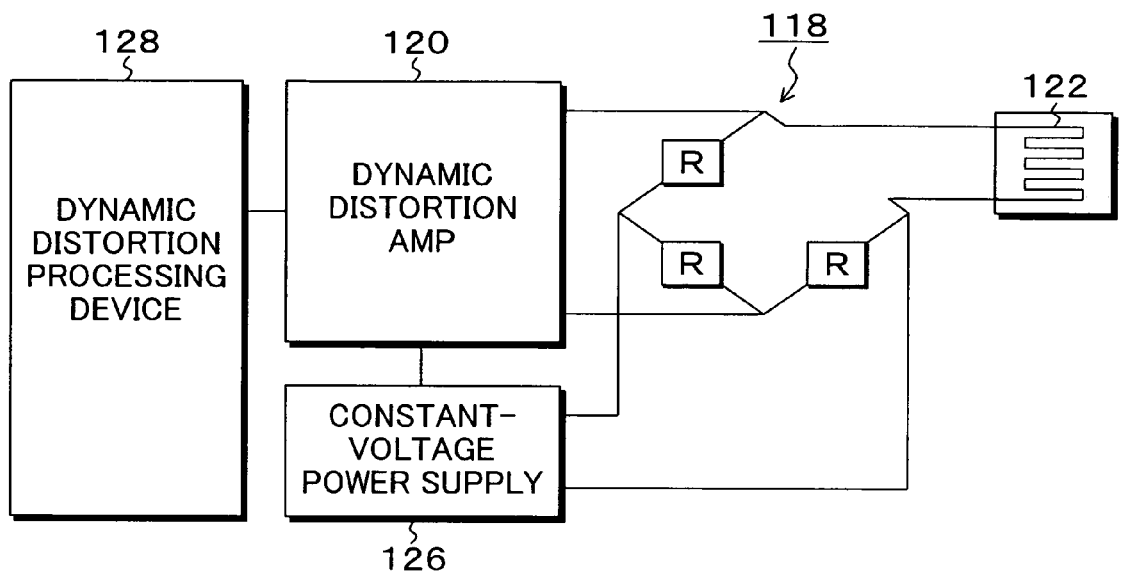
FIGS. 3A to 3C are explanatory diagrams of a conventional dynamic distortion measurement device using Wheatstone bridge.
Figure 3B:
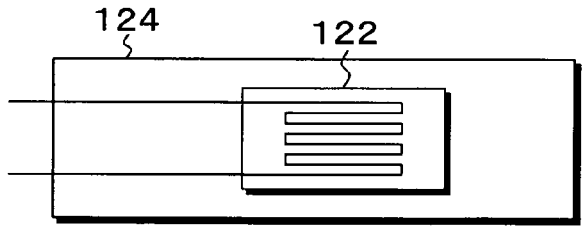
Figure 3C:
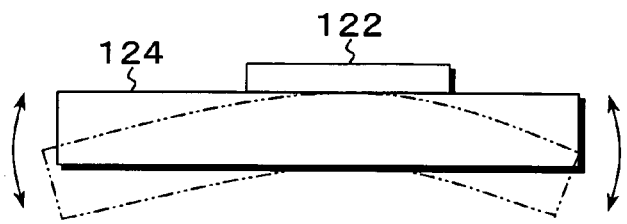
Figure 4:
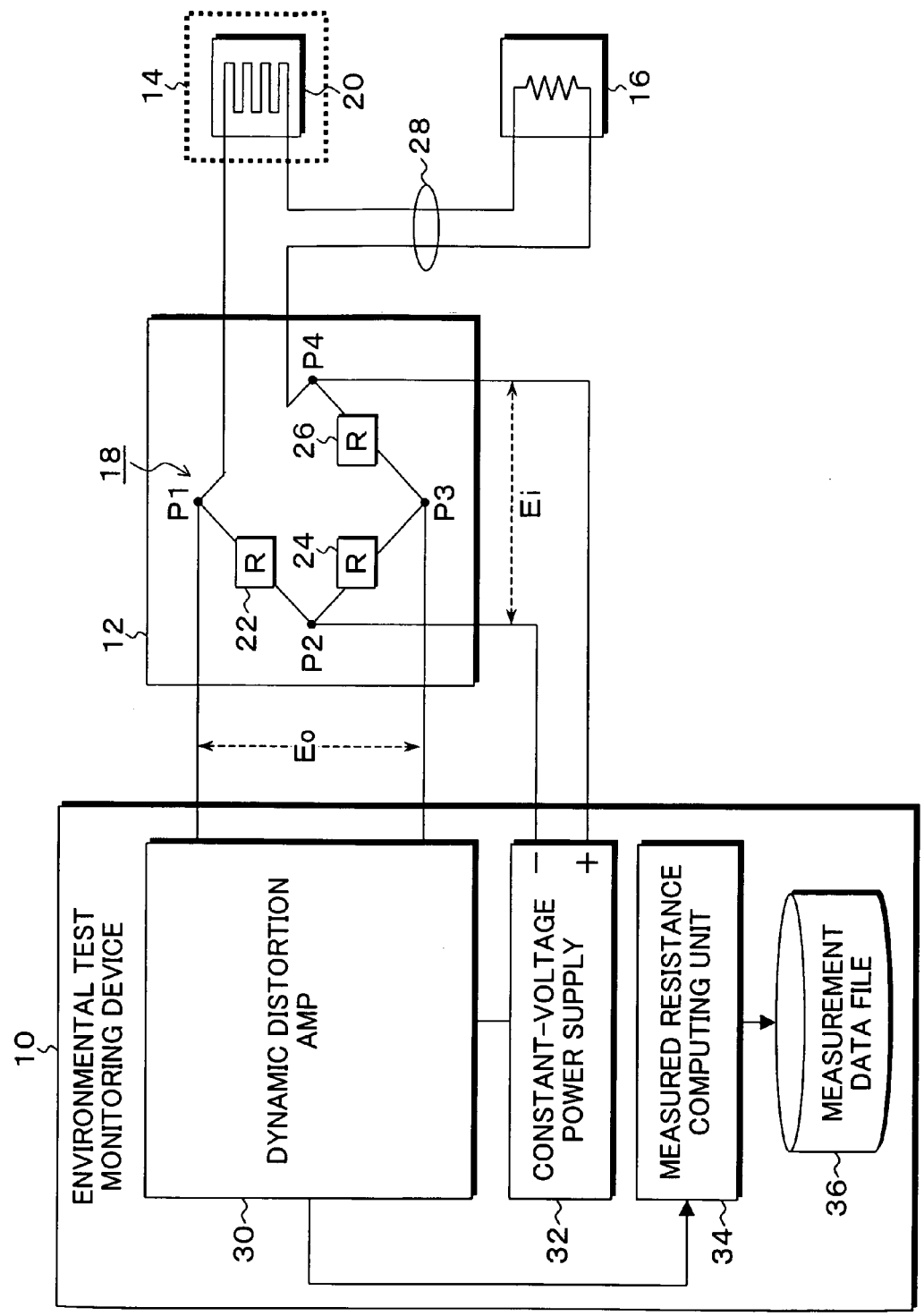
FIG. 4 is a circuit block diagram showing an embodiment of a sample resistance measurement device according to the present invention.

FIG. 4 is a circuit block diagram showing an embodiment of a sample resistance measurement device according to the present invention. The present embodiment employs, as an example, a case applied to environmental test equipment for performing a vibration test, thermal shock test, or the like; wherein an environmental test monitoring device 10 serves as a measurement device main body, a bridge box 12 and a shielding box 14 are disposed in the side of the measurement device main body, and a cable 28 which serves as a measurement probe is connected to a sample 16 in the side of the tester away from the measurement device main body. In the environmental test monitoring device 10, a dynamic distortion amplifier 30, a constant-voltage power supply 32, a measured resistance computing unit 34, and a measurement data file 36 are provided. The measured resistance computing unit 34 and the measurement data file 36 are realized by hardware functions of a computer incorporated in the environmental test monitoring device 10. A Wheatstone bridge circuit 18 is housed in the bridge box 12, the Wheatstone bridge circuit 18 is comprised of bridge resistances of four sides, and, among them, a second resistance 22, a third resistance 24, and a fourth resistance 26 are incorporated in the bridge box 12; however, as a first resistance, a distortion gauge 20 housed in the shielding box 14 and a resistance component ΔR of the sample 16 which serves as a resistance measurement object are connected in series by two signal lines lead from the Wheatstone bridge circuit 18. Herein, the distortion gauge 20 housed in the shielding box 14 is a fixed reference resistance having a predetermined resistance value R of which variation caused by environmental conditions is suppressed, and a stable housing environment shielding influence of external force and external air (temperature and moisture) is provided as the shielding box 14. Therefore, the distortion gauge 20 housed in the shielding box 14 is not affected by the variation in the vibration and temperature in the measurement environment; consequently, a value as a constant fixed reference resistance which is always stable is maintained without variation in the resistance due to the vibration, temperature, or the like. A constant bridge input voltage Ei is applied to connection points P2 and P4 of the Wheatstone bridge circuit 18 from the constant-voltage power supply 32 provided in the environmental test monitoring device 10. In the present embodiment, resistance variation in an environmental test of the sample 16 can be measured at high resolution of 10 mΩ order, and, in this case, for example, Ei=2.0 volts are applied as the bridge input voltage Ei. Each of the second resistance 22, the third resistance 24, and the fourth resistance 26 constituting the bridge resistances of the Wheatstone bridge circuit 18 has a same resistance value R, and the distortion gauge 20 constituting part of the first resistance also has the same resistance value R. In the present embodiment, the configuration of a conventional dynamic distortion measurement device is utilized as much as possible as the dynamic distortion amplifier 30, the Wheatstone bridge circuit 18, and the distortion gauge 20 so as to reduce cost; and the resistance value R of the distortion gauge 20 is R=120 Ω which is generally used in a dynamic distortion measurement device, and the resistance value R of each of the second resistance 22, the third resistance 24, and the fourth resistance 26 is also R=120 Ω. On the other hand, the resistance of a soldering connection part of a circuit component such as an IC mounted on a circuit port serves as a detection object as the resistance component ΔR of the sample 16 serving as a measurement object, and the resistance component ΔR of the sample 16 is an extremely small resistance value when normal soldering connection is formed. Therefore, in the present embodiment, when the distortion gauge 20 and the sample 16 are connected in series as the resistance of one side of the Wheatstone bridge circuit 18, equivalently, minute resistance variation of the distortion gauge 20 is generated by an environmental test of the sample 16, and the amount of the resistance variation of the distortion gauge 20 is measured. Therefore, in a state before starting the test (sample no-load state), resistance bridge connection is established by the resistance component (R+ΔR) of a series circuit of the distortion gauge 20 and the sample 16 which is the resistance value of one side of the Wheatstone bridge circuit 18 and the other three bridge resistances R, and, in accordance with application of the bridge input voltage Ei, the bridge output voltage Eo corresponding to the resistance component ΔR of the sample 16 of unbalanced bridge resistances is input from the Wheatstone bridge circuit 18 to the dynamic distortion amplifier 30. When an environmental test, for example, a vibration test of the sample 16 is started in this state, external force caused by vibration is applied merely to the sample 16, the external force causes variation in resistance caused by stress variation in the soldered part of the circuit component in the sample 16, and the bridge output voltage Eo of the Wheatstone bridge circuit 18 corresponding to this resistance variation is input to the dynamic distortion amplifier 30. The dynamic distortion amplifier 30 is same as the amplifier used in a conventional dynamic distortion measurement device, and outputs a carrier wave current signal of a predetermined frequency which is varied in accordance with the bridge output voltage Eo. In a normal environmental test such as a vibration test, the bridge output voltage Eo output from the Wheatstone bridge circuit 18 is varied in a range of 10 Hz to 2 KHz, and, corresponding to this, the carrier wave current signal of the dynamic distortion amplifier 30 has a frequency of 50 Hz to 10 KHz of sufficiently high resolution power. After the bridge output voltage Eo is amplified, it is converted into carrier wave output and output to the measured resistance computing unit 34. The measured resistance computing unit 34 samples the carrier wave signal of the dynamic distortion amplifier 30 by an A/D converter using a sampling clock of for example about ten times the carrier wave frequency and converts it into digital data, detects the peak level of the carrier wave signal as the bridge output voltage Eo from the Wheatstone bridge circuit 18, and calculates the resistance component ΔR of the sample 16 by the following expression when each of the bridge resistances of the Wheatstone bridge circuit 18 is R=120 Ω and the bridge input voltage Ei=2 volts.

$$\Delta R = \frac{4REo}{Ei - 2Eo} \quad (1)$$

Details of the calculation expression of the expression (1) of the resistance ΔR of the sample 16 will be elucidated in the later description. The value of the resistance ΔR of the sample 16 calculated by the measured resistance computing unit 34 during the environmental test is stored and saved in the measurement data file 36.

Figure 5:
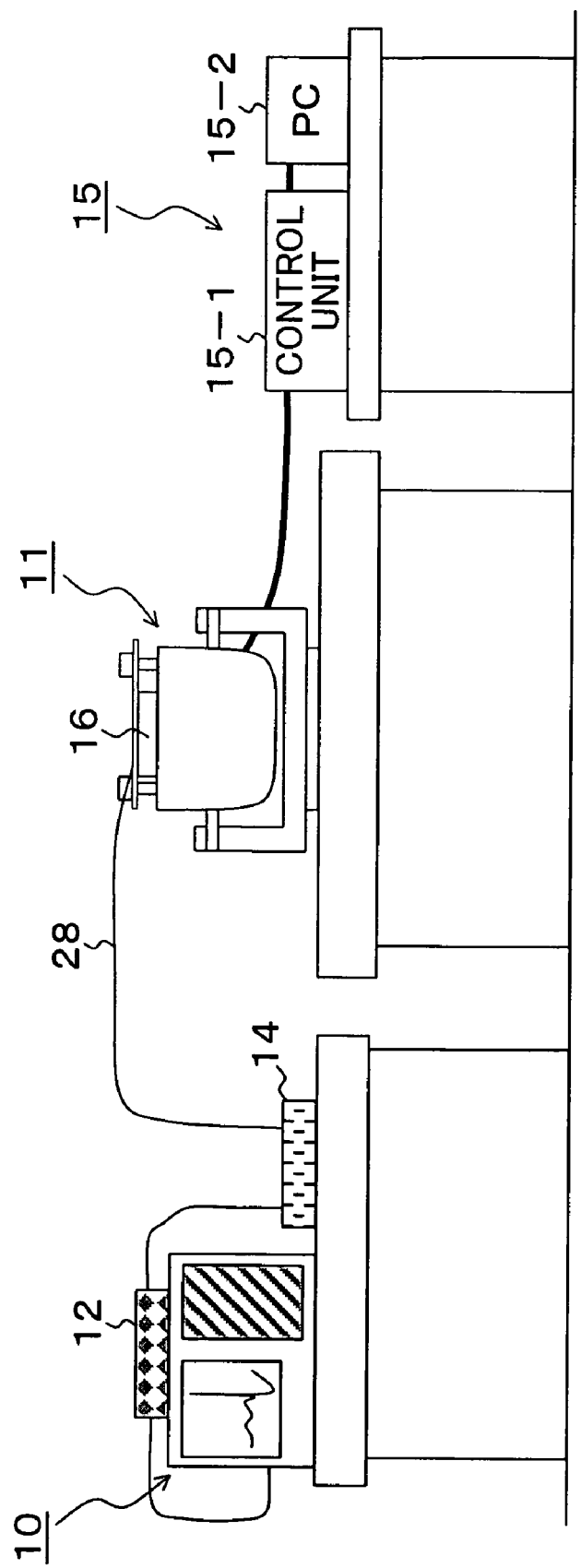
FIG. 5 is an explanatory drawing of the present embodiment applied to environmental test equipment.

FIG. 5 is an explanatory diagram of the present embodiment applied to environmental test equipment. In FIG. 5, the environmental test equipment employs a vibration test as an example. Since it is a vibration test, the environmental test monitoring device 10, a vibration tester 11, and a vibration test control device 15 are placed. The vibration test control device 15 is comprised of a personal computer 15-2 for controlling the vibration test and a control unit 15-1 for controlling the vibration tester 11. The vibration tester 11 has the sample 16 loaded on the tester. In the side of the environmental test monitoring device 10, the bridge box 12 housing the Wheatstone bridge circuit 18 and the shielding box 14 housing the distortion gauge 20 serving as a fixed reference resistance are placed, and a cable 28 is lead from the environmental test monitoring device 10 side and connected to the sample 16 of the vibration tester 11. The environmental test equipment of FIG. 5 employs, as an example, a case in which the resistance of the sample 16 is measured by one channel; however, in actual environmental test equipment, vibration tests are performed on a number of samples from the environmental test monitoring device 10 side by multi-channels so as to monitor them, and, in the case of multi-channels, the configuration of the present embodiment shown in FIG. 4 is disposed as many as the required channels.

Figure 6:
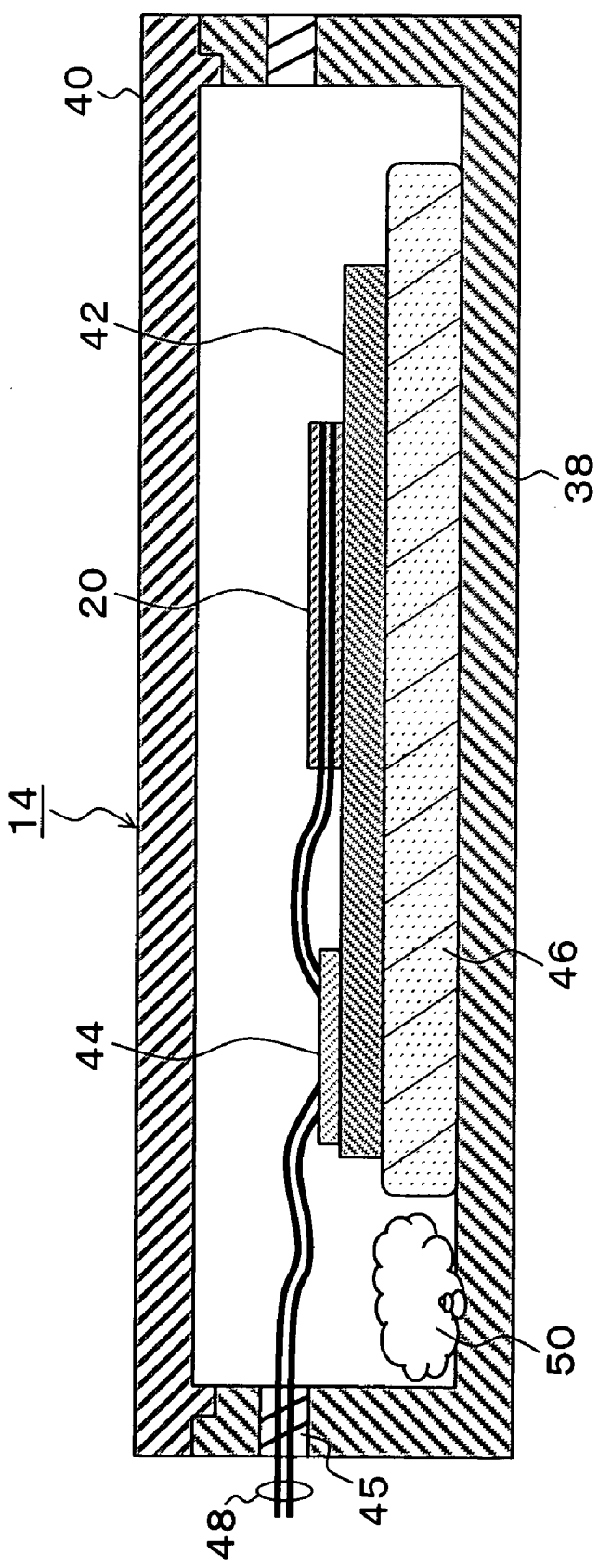
FIG. 6 is an explanatory diagram of a shielding box housing the distortion gauge in the present embodiment.

FIG. 6 is an explanatory diagram of the shielding box 14 housing the distortion gauge 20 in the present embodiment. In FIG. 6, the shielding box 14 is comprised of a box main body 38 and a lid 40, and each of them is formed of a material which shields external force and external air/heat. For example, the outside of the box main body 38 and the lid 40 is desired to be covered by a formed substance such as urethane foam in order to prevent inflow of heat from external air. In addition, the external surfaces are coated with glazing coating or white-based coating for reflecting heat. The distortion gauge 20 is fixed on a base substrate 42 in the shielding box 14, a lead wire from the distortion gauge 20 is connected to a junction terminal 44, and then, a cable 48 composed of two signal lines is lead from the junction terminal 44 and connected to the Wheatstone bridge circuit 18 and the sample shown in FIG. 4. As the base substrate 42 for fixing the distortion gauge 20, a material having the thermal expansion coefficient same as the distortion gauge 20 is used. Moreover, the base substrate 42 uses a material which has, with respect to the distortion gauge 20, sufficiently high rigidity, small self heating, and equivalent thermal conductivity. The base substrate 42 on which the distortion gauge 20 is fixed is fixed by an elastic adhesive 46 in the box main body 38. Even when external vibration or the like is applied to the box main body 38, the elastic adhesive 46 absorbs it so that it is not directly transmitted to the distortion gauge 20 of the base substrate 42. At the part where the signal line 48 is lead to outside from the box main body 38, a heat-insulating shield packing 45 is incorporated so as to maintain air tightness. As the heat-insulating shield packing 45, a heat-insulating adhesive is used or rubber packing having high adhesiveness is used. Furthermore, in the shielding box 14, a moisture absorbent 50 using a drying agent or the like is housed such that influence of moisture can be reduced. As a result of housing the distortion gauge 20 in such shielding box 14 shielding influence of external force and external air (temperature and moisture) when the distortion gauge 20 is connected to the Wheatstone bridge circuit 18 of FIG. 4, it can function as a fixed reference resistance having a stable resistance value all the time without being influenced by external force or external air.

Figure 7A:
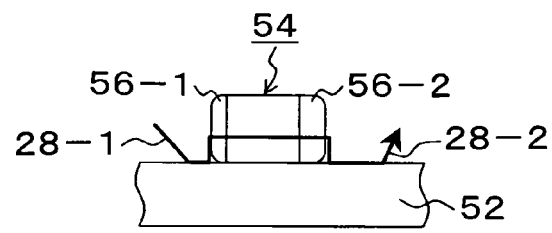
FIGS. 7A to 7E are explanatory diagrams of circuit components which serve as samples of resistance measurement of the present embodiment.
Figure 7B:
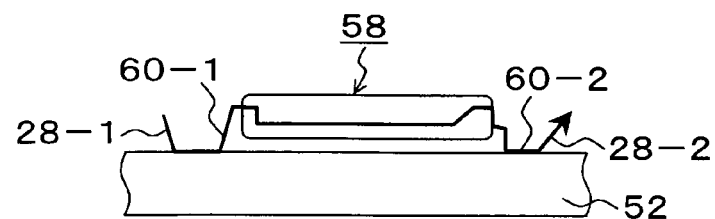
Figure 7C:
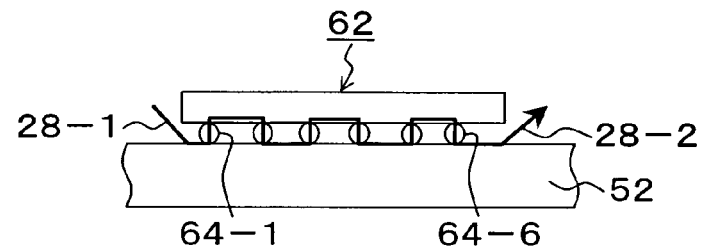
Figure 7D:
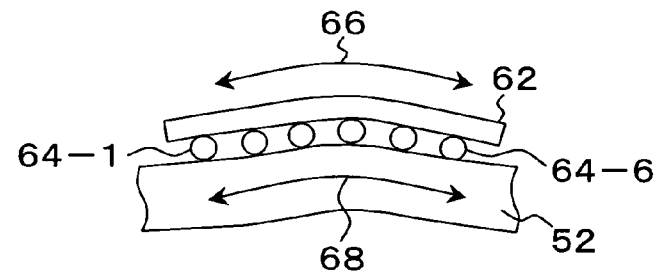
Figure 7E:
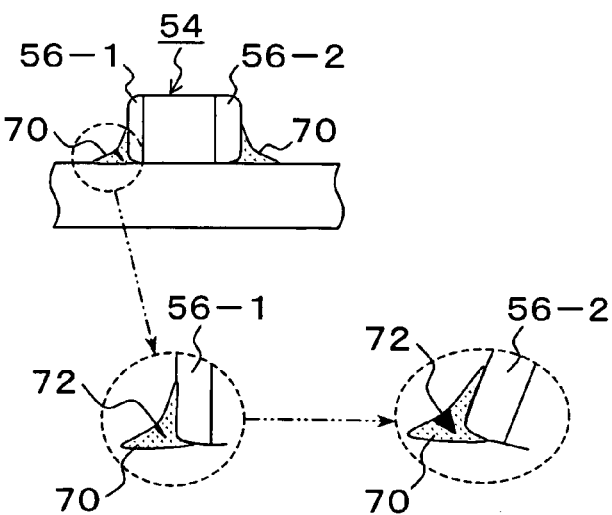

FIGS. 7A to 7E are explanatory diagrams of circuit components which serve as samples of resistance measurement of the present embodiment. FIG. 7A is a surface-mount component 54 mounted on a circuit substrate 52, and the parts of electrodes 56-1 and 56-2 are soldered so as to electrically connect themselves to a pattern on the circuit substrate 52. In order to measure resistance variation involved in a vibration test of the solder connection parts in the surface-mount component 54, a cable 28-1 is connected to the substrate pattern in the side of the electrode 56-1, and another cable 28-2 is connected to the pattern on the circuit substrate which is lead from the electrode 56-2. As a result, a circuit through the two soldered parts of the electrodes 56-1 and 56-2 of the surface-mount component 54 is formed between the cables 28-1 and 28-2, and resistance variation at the soldered parts due to distortion applied in a vibration test can be captured. FIG. 7B is a case in which a QFP package component 58 is mounted on the circuit substrate 52, wherein the QFP package component 58 is connected to the pattern on the circuit substrate 52 by soldering by pads 60-1 and 60-2. Therefore, the cables 28-1 and 28-1 are connected to the pattern on the circuit substrate 52 of the pads 60-1 and 60-2. As a result, a circuit from the cable to the cable 28-2 via the pads 60-1 and 60-2 through the soldered parts is formed. The QFP package component 58 has a large number of pads, and soldered points of the large number of pads are connected in series such that the cables 28-1 to 28-2 are connected at both ends thereof. FIG. 7C is a case in which a BGA package component 62 is mounted on the circuit substrate 52, wherein solder connection onto the pattern on the circuit substrate 52 is established by BGAs 64-1 to 64-6 on the lower surface of the component. Therefore, when the soldered parts by means of the plurality of BGAs 64-1 to 64-6 are connected in series, the cable 28-1 is connected to the BGA 64-1 side, and the cable 28-2 is connected to the BGA 64-6 side, a circuit through two soldered parts among a plurality of them by means of the BGAs 64-1 to 64-6 is formed, and resistance variation in a vibration test or the like can be detected. FIG. 7D is a state in which distortion 66, 68 caused by a vibration test is applied to the BGA package component 62 mounted on the circuit substrate 52; in response to such distortion 66, 68 caused in the vibration test, distortion is caused in the soldered parts by means of the BGAs 64-1 to 64-6 with respect to the circuit substrate 52; and the distortion causes variation in the resistance component. FIG. 7E is an explanatory drawing of a crack generated in a soldered point of the surface-mount component 54 in a vibration test. In FIG. 7E, the surface-mount component 54 electrically connects the electrodes 56 to the circuit pattern on the circuit substrate 52 by a solder connection part 70. When distortion applied to the solder connection part 70 during a vibration test generates a crack 72 as shown in the lower side in an enlarged manner, and generation of the crack 72 causes the resistance component of the solder connection part 70 to increase. When the vibration test further progresses, and the crack is enlarged like the crack 72 shown in the right side, the resistance of the solder connection part 70 is further increased. In a possible worst case, the crack 72 is enlarged and the solder connection part 70 is disconnected. The solder connection part 70 can be seen from outside in the case of the surface-mount component 54; however, in the cases of the QFP package component 58 of FIG. 7B and the BGA package component 62 of FIG. 7C, the soldered parts by means of the pads 60 and the BGAs 64 cannot be seen from outside, and cracks in the soldered parts cannot be checked after a vibration test is performed. In such cases, in the present embodiment, resistance variation is directly measured by connecting the soldered parts of a circuit component in series; therefore, if a crack is generated, the resistance is slightly increased corresponding to generation of the crack, and, by comparing the resistance value at the end of the test with the resistance value before starting the test, whether a crack is generated or not in the soldered parts of the circuit component which serves as a sample can be readily known. Although variation in the measurement resistance caused by generation of a crack is slight, even the resistance variation caused by generation of a crack can be reliably measured since the present embodiment has high resolution power of 10 mΩ order. In measurement of resistance variation during a vibration test of soldered points (soldered parts) of the circuit components mounted on circuit substrates like FIGS. 7A to 7E, resistance variation is measured by connecting the soldered points of a plurality of circuit components in series so as to, for example, connect normally 500 to 1000 points in series. The resistance value of the case when the 500 to 1000 points of the soldered points are connected in series is about 5 Ω, and minute resistance variation caused by distortion in a vibration test is added to the initial resistance of 5 Ω during the vibration test. Resistance variation after the vibration test is finished can be obtained by subtracting the resistance value in a no-load state before starting the test from the resistance value after the test is finished. In an actual environmental test, resistance variation during the test is measured while 5 to 1500 points serves as one channel in practice.

Figure 8A:
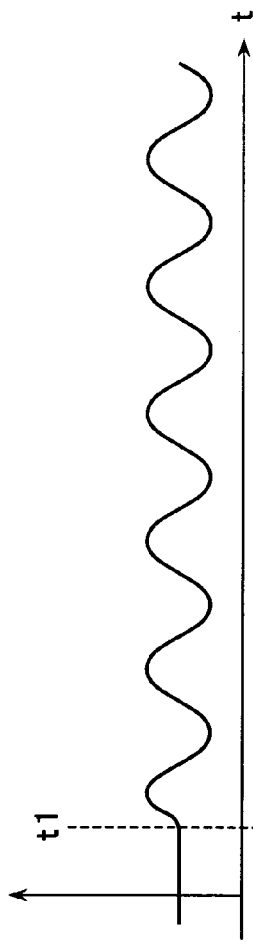
FIGS. 8A to 8D are time charts of an output voltage of the Wheatstone bridge, dynamic distortion amplifier output, a sample clock of an A/D converter in the present embodiment.
Figure 8B:
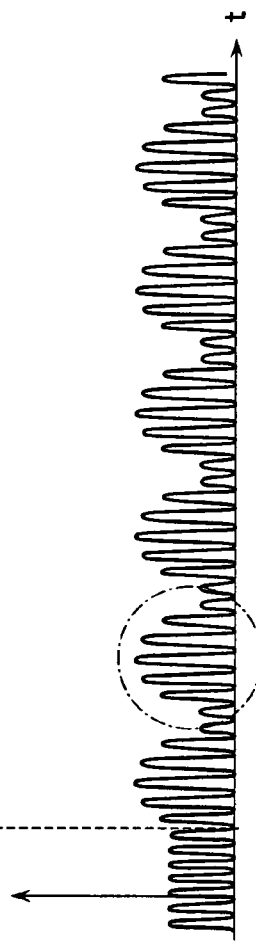
Figure 8C:
Figure 8D:
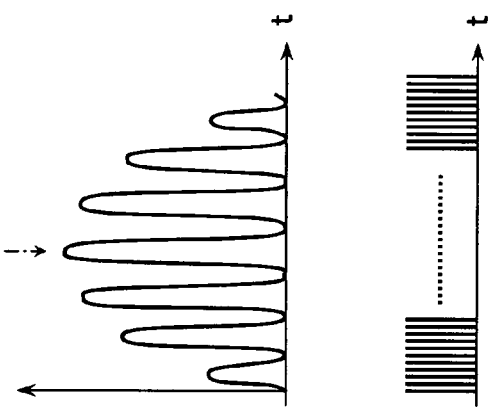

FIGS. 8A to 8D are time charts of the output voltage Eo of the Wheatstone bridge circuit 18, the output signal of the dynamic distortion amplifier 30, and the sample clock of the A/D converter in the present embodiment. FIG. 8A is the bridge output voltage Eo of the Wheatstone bridge circuit 18 and employs a case, as an example, in which a vibration test is started at time t1. Before start of the test at time t1, the bridge output voltage Eo corresponding to constant resistance of the soldered points of the sample 16 is obtained. When the vibration test is started at the time t1, the resistance of the soldered points of the sample 16 is varied in accordance of periodic variation of the distortion caused in the vibration test, and the bridge output voltage Eo is also varied. The bridge output voltage Eo of FIG. 8A is input to the dynamic distortion amplifier 30, and the dynamic distortion amplifier output signal modulated by the carrier wave signal of a predetermined frequency is output as shown in FIG. 8B. The dynamic distortion amplifier output signal is subjected to sampling by the A/D converter, and the peak levels are detected. FIG. 8C enlarges part of the dynamic distortion amplifier output signal, and, with respect to this, sampling of the dynamic distortion amplifier output signal by the sample clock of the A/D converter having sufficient resolution power is performed as shown in FIG. 8D, the peak levels of the dynamic distortion amplifier output signal are detected, these are read as the output signal Eo of the Wheatstone bridge circuit 18, and computing of the resistance $\Delta R$ of the sample 16 is performed in the measurement resistance computing unit 34.

Figure 9:
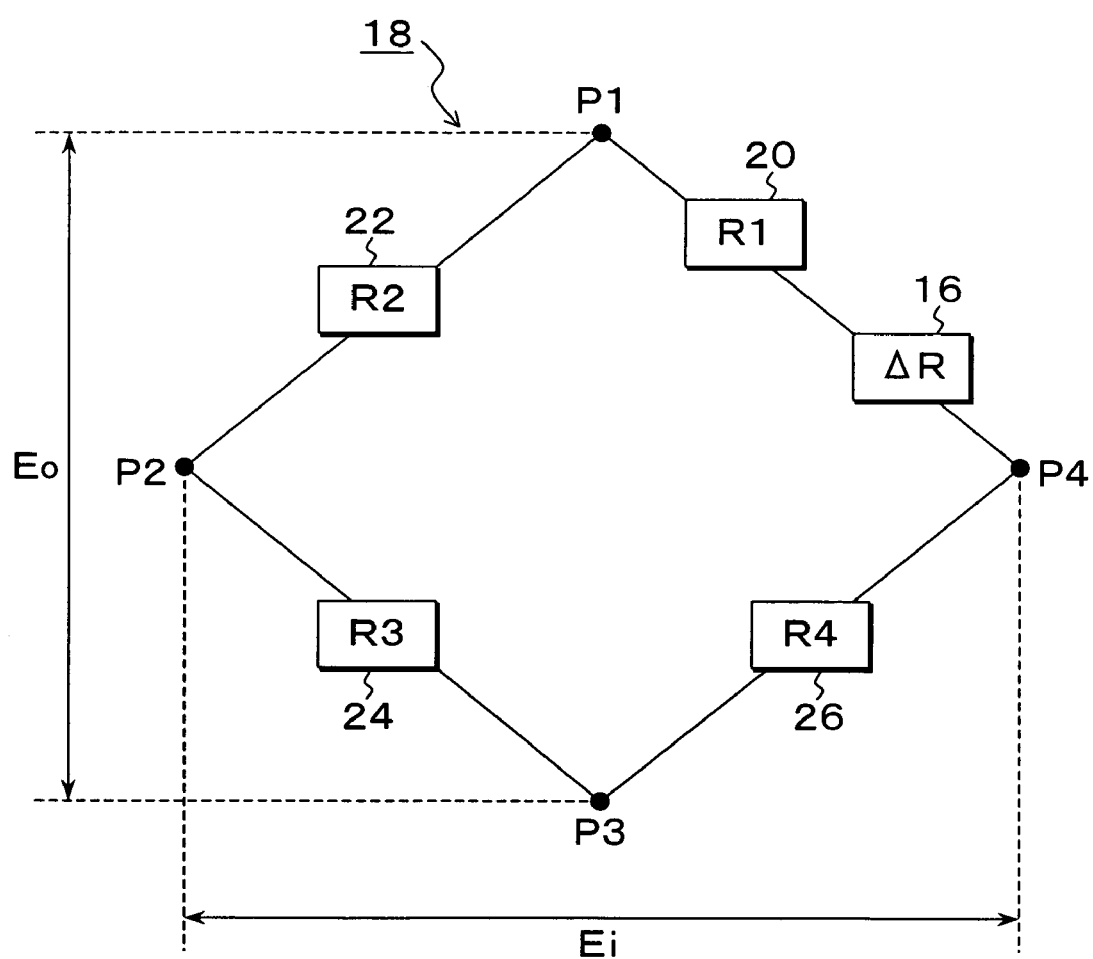
FIG. 9 is an equivalent circuit diagram of the Wheatstone bridge in the present embodiment for detecting minute resistance of a sample.

FIG. 9 is an equivalent circuit diagram of the Wheatstone bridge circuit 18 in the present embodiment for detecting minute resistance of the sample 16, and calculation principles of the minute resistance $\Delta R$ of the sample in the present invention will be described as the following with reference to FIG. 9. In the Wheatstone bridge circuit 18 of FIG. 9, bridge resistances are connected at respective bridge sides connecting bridge connection points P1, P2, P3, and P4; the part between the bridge connection points P1 and the P4 is the first resistance; and the first resistance is the series resistance of the fixed reference resistance R1 caused by the distortion gauge 20 and the resistance $\Delta R$ of the soldered points of the sample 16 (R1+$\Delta R$). The resistance values of the other second resistance 22, third resistance 24, and fourth resistance 26 are R2, R3, and R4. In such Wheatstone bridge circuit 18, the following expression is established between the bridge input voltage Ei and the bridge output voltage Eo.

$$Eo = \frac{R1 \times R3 - R2 \times R4}{(R1 + R2) \times '(R3 + R4)} \times Ei \quad (2)$$

Herein, when the bridge resistance R1 is the distortion gauge 20, and the resistance is varied merely by $\Delta R$ by the connection with the sample 16, the following expression can be established.

$$Eo = \frac{(R1 + \Delta R) \times R3 - R2 \times R4}{(R1 + \Delta R + R2) \times '(R3 + R4)} \times Ei \quad (3)$$

Herein, when R1=R2=R3=R4=R, $$Eo = \frac{(R^2 + R \times \Delta R - R^2)}{(2R + \Delta R) \times 2R} \times Ei = \frac{\Delta R}{(2R + \Delta R) \times 2} \times Ei \quad (4)$$

is obtained.

When this is changed into a calculation expression of $\Delta R$, it will be as the following.

$$\Delta R = \frac{4REo}{Ei - 2Eo} \quad (5)$$

This is the expression (1) per se.

As a specific example, the resistance R of the distortion gauge used in a general dynamic distortion meter is R=120 $\Omega$; therefore, when the present embodiment also uses this, and the bridge input voltage Ei is Ei=2.0 volt,

[Expression 8]

$$\Delta R = \frac{240Eo}{1 - Eo} \quad (6)$$

is obtained.

Figure 10:
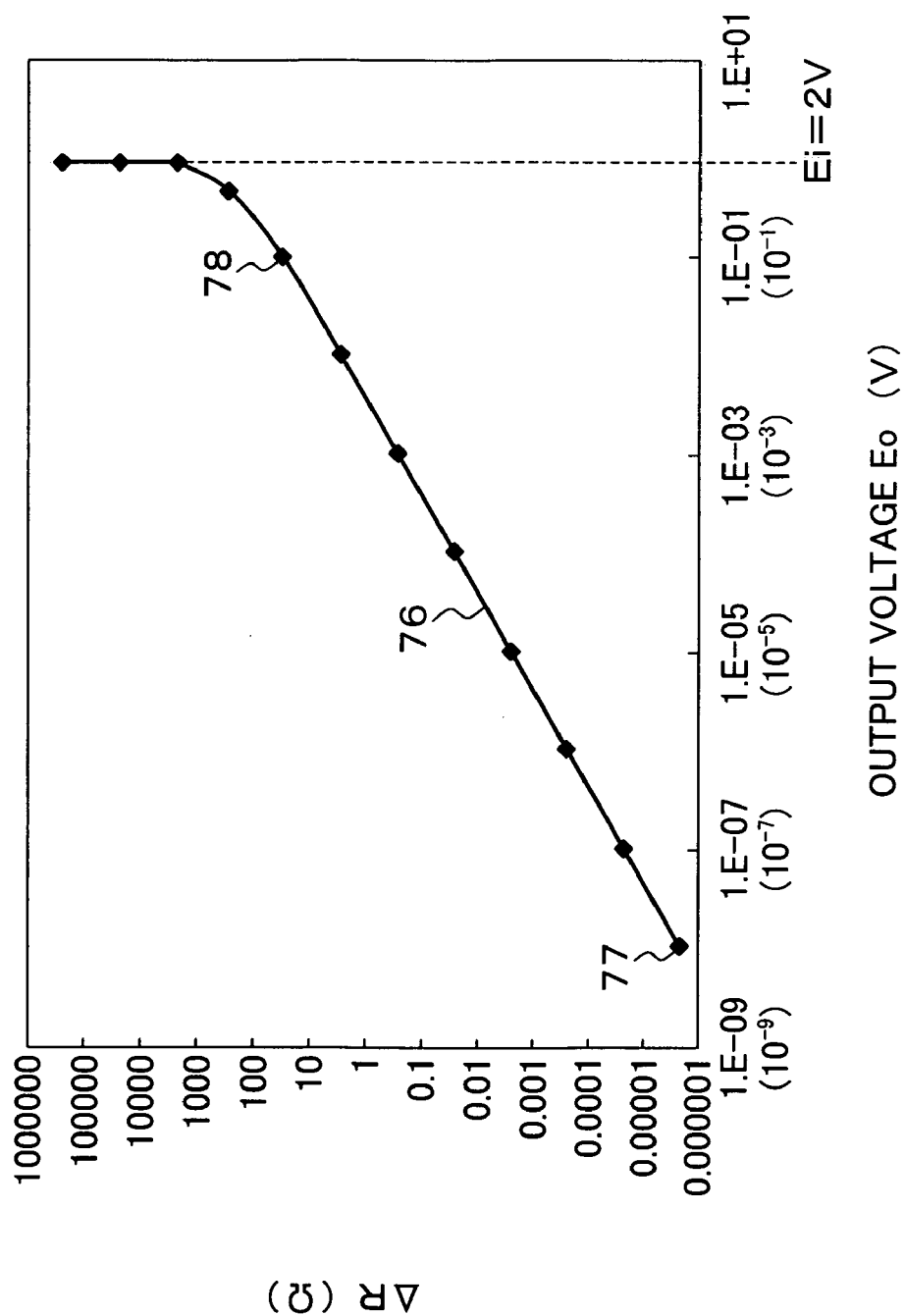
FIG. 10 is a characteristic chart showing the relation between the output voltage of the Wheatstone bridge and sample resistance.

FIG. 10 is a characteristic chart showing the resistance $\Delta R$ calculated with respect to variation of the output voltage Eo by the above described expression (6). Note that $10^{-n}$ of the output voltage Eo of the horizontal axis is shown as "1.E–n". For example, 1.E–03=$10^{-3}$=0.001 volt. In this calculated characteristic 76, the resistance $\Delta R$ is linearly varied with respect to variation of the output voltage Eo from Eo=2×$10^{-9}$ at a calculation start point 77 until Eo=$10^{-1}$=0.1 volt which is at a calculation point 78. The linearity is broken over the calculation point 78, and it is saturated at the bridge input voltage Ei=2 volt. Therefore, in the present embodiment, the resistance $\Delta R$=26.666667 $\Omega$ at the calculation point 78 can be set as a maximum range, and the value of the resistance $\Delta R$ can be measured with extremely high accuracy below that range.

Figure 11:
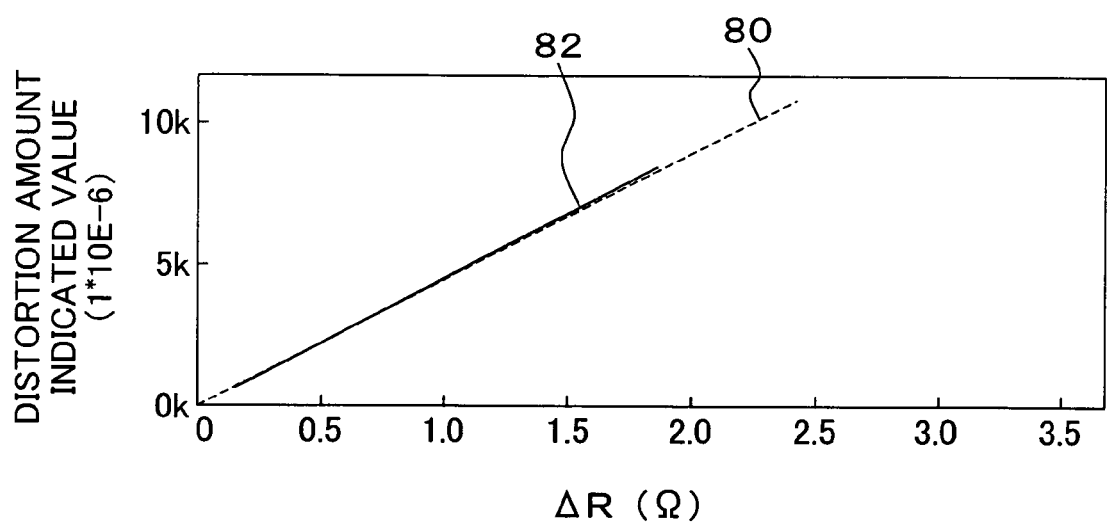
FIG. 11 is a characteristic chart showing a calculated characteristic and an actually measured characteristic about the relation between distortion amount indicated values and sample resistance based on the output voltage of the Wheatstone bridge.

FIG. 11 is an explanatory diagram showing an actually measured characteristic in comparison with the calculated characteristic in the case in which the vertical axis shows distortion amount indicated values when the output of the dynamic distortion amplifier 30 according to the present embodiment is to be displayed by a dynamic distortion measurement device and the horizontal axis shows the resistance $\Delta R$ measured in the present embodiment. In FIG. 11, the distortion amount indicated value of the vertical axis corresponds to the bridge output voltage Eo in FIG. 10, and the horizontal axis is the resistance $\Delta R$ calculated from the bridge output voltage Eo according to the present embodiment. In this case, it has been confirmed that an actually measured characteristic 82 is obtained as a linear characteristic in the range shown in the drawing with respect to the calculated characteristic 80 of a broken line.

Figure 12:
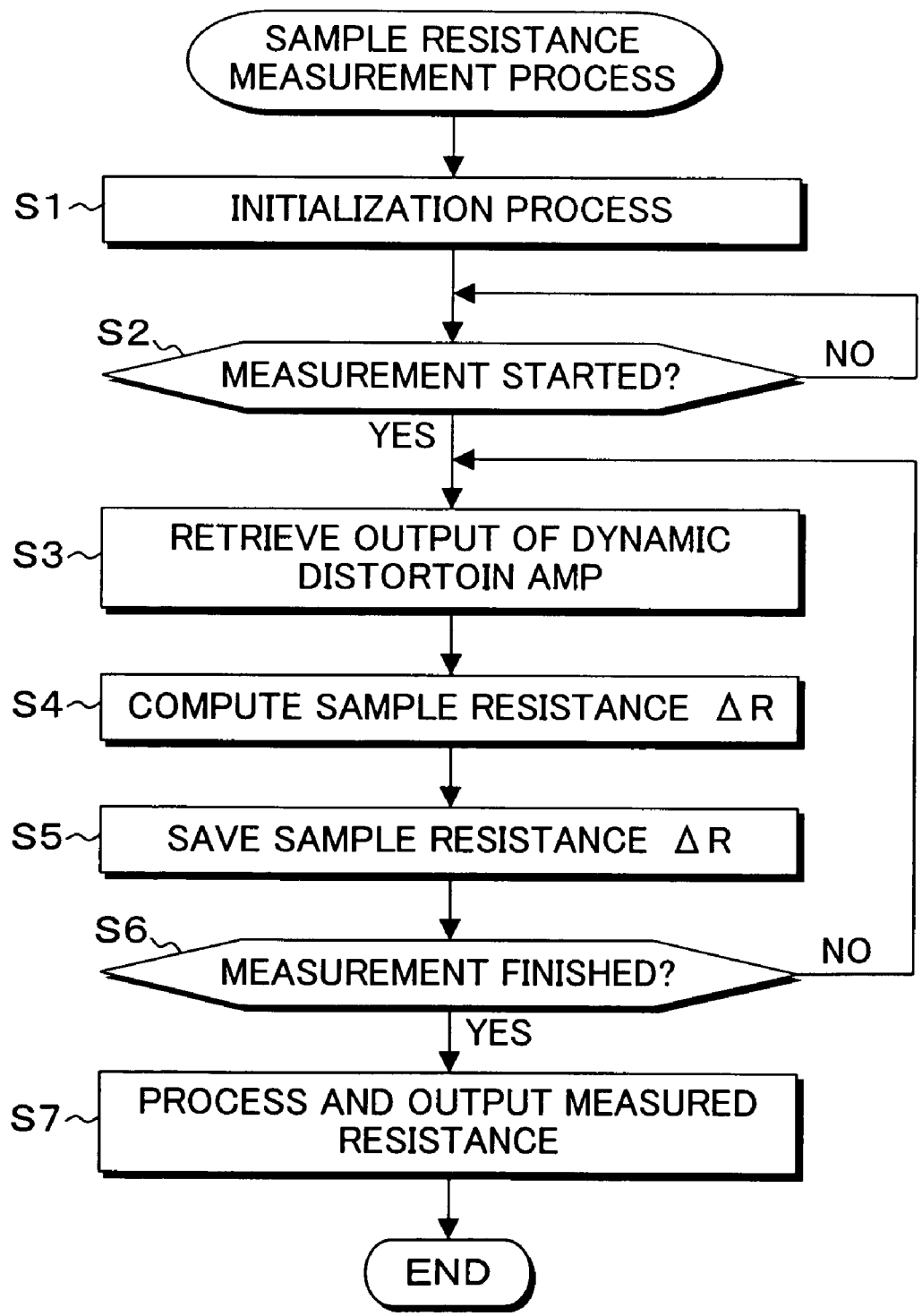
FIG. 12 is a flow chart of a sample resistance measurement process in the present embodiment.

FIG. 12 is a flow chart of a sample resistance measurement process in the present embodiment, and it will be as the following when described with reference to FIG. 4. In FIG. 12, in the sample resistance measurement process, after an initialization process accompanying power-on of the environmental test monitoring device 10 is performed in step S1, whether measurement is started or not is checked in step S2. The measurement is started when the control unit 15-1 drives the vibration test device 11 by a test starting operation of the personal computer 15-2 provided in the vibration test control device 15 of FIG. 5. When measurement start is determined in step S2, the process proceeds to step S3 in which output of the dynamic distortion amplifier 30 is retrieved by AD conversion, the sample resistance R is computed in accordance with the expression (5) in step S4, and the calculated sample resistance $\Delta R$ is saved in step S5. Such processes from step S3 are repeated until measurement is finished in accordance with finish of the vibration test in step S6. When the measurement is finished, necessary processes are performed for the measured resistance stored in the measurement data file 36 so as to output it in step S7. A predetermined threshold value is set during the measurement based on the sample resistance $\Delta R$ in a no-load state before start of the measurement, and, when a mean value of the sample resistance $\Delta R$ obtained during measurement according to, for example, a moving average of a predetermined number of samples excesses a threshold value, crack generation or the like at the soldered point is determined, and crack generation may be added to the measurement data as event information. As a matter of course, in temporary interruption in which a soldered point is completely exfoliated during the vibration test, the resistance value is saturated to a maximum value; therefore, an alert is output and the vibration test is forcibly terminated in this case.

Figure 13:
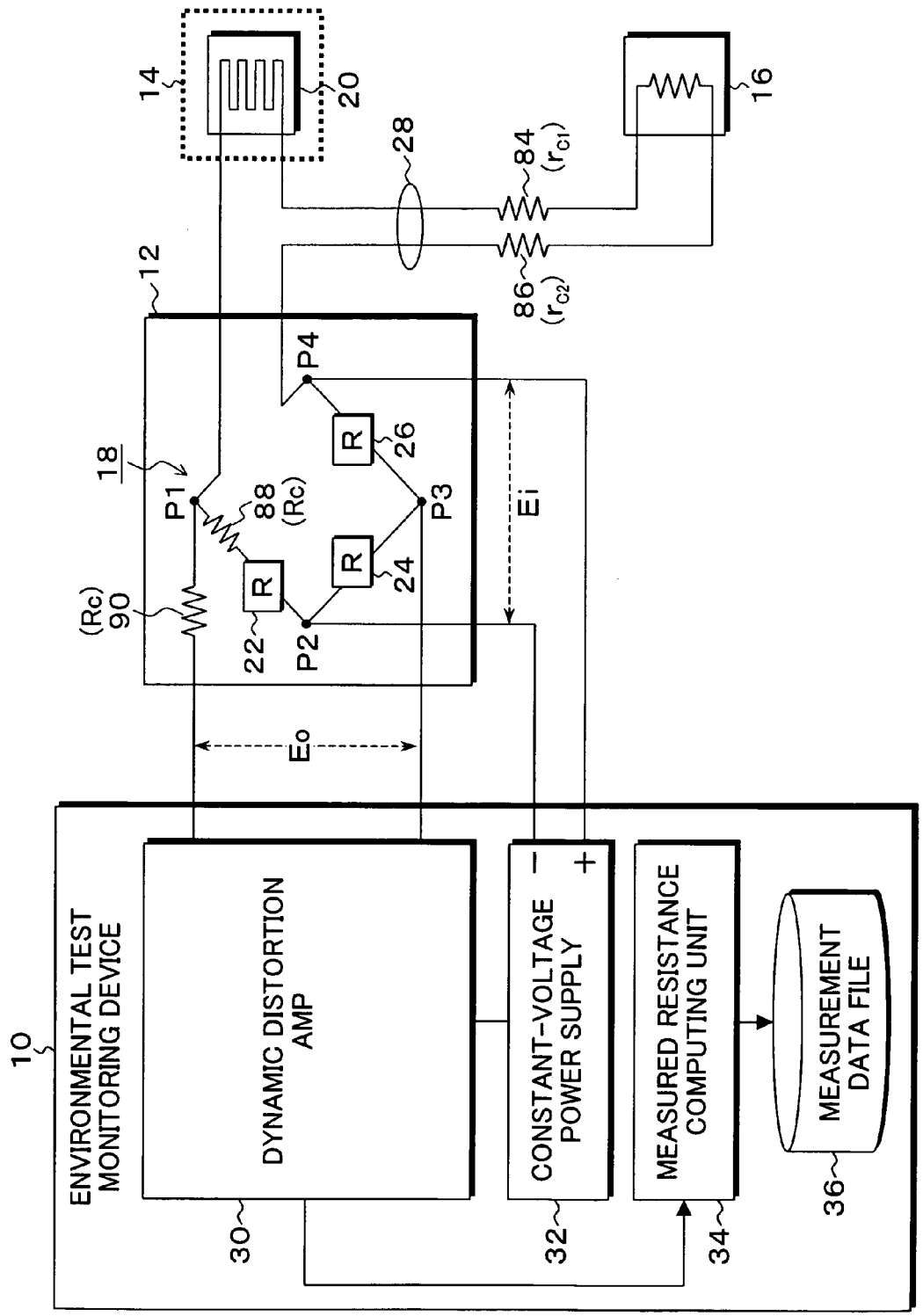
FIG. 13 is an explanatory diagram of another embodiment for canceling out the line resistance of a cable connecting a sample.

FIG. 13 is an explanatory diagram of another embodiment for canceling out the line resistance of a cable connecting a sample. In the present embodiment, the cable 28 which is used as a measurement probe is lead and connected from the environmental test monitoring device 10 side to the sample 16 which serves as a measurement object, and wiring resistance of the cable 28 is not problematic when the length of the cable 28 is short like about 2 to 3 meters; however, when the cable 28 is long like 10 to 20 meters, for example, accurate resistance of the sample 16 cannot be measured since variation due to the wiring resistance is contained in the measured resistance ΔR of the sample 16. Therefore, in the embodiment of FIG. 13, in order to cancel out wiring resistances 86 and 84 of the cable 28, a compensation resistance 88 is connected in series with the second resistance 22 of the side of the bridge connection points P1 and P2 adjacent to the bridge connection points P1 and P4 with which the distortion gauge 20 and the sample 16 of the Wheatstone bridge circuit 18 are connected in series. The resistance value Rc of the compensation resistance 88 is $$Rc=rc1+rc2$$

wherein the resistance values rc1 and rc2 of the wiring resistances 84 and 86 of the cable 28 are added. Furthermore, a compensation resistance 90 is inserted and connected in the signal line connecting the bridge connection point P1 of the Wheatstone bridge circuit 18 and the dynamic distortion amplifier 30, and this compensation resistance 90 also has the same resistance value Rc as that of the compensation resistance 88. When the resistance Rc caused by the compensation resistances 88 and 90 for canceling out the wiring resistances rc1 and rc2 of the cable 28 is connected to the Wheatstone bridge circuit 18, the resistance values rc1 and rc2 of the wiring resistances 84 and 86 of the cable 28 are canceled out in the Wheatstone bridge circuit 18, and the bridge output voltage Eo which is dependent merely on the resistance ΔR of the sample 16 can be input to the dynamic distortion amplifier 30. Such compensation method of the wiring resistance of FIG. 13 is basically same as a method which is performed when the probe cable is lengthened in a conventional dynamic distortion measurement device.

Figure 14:
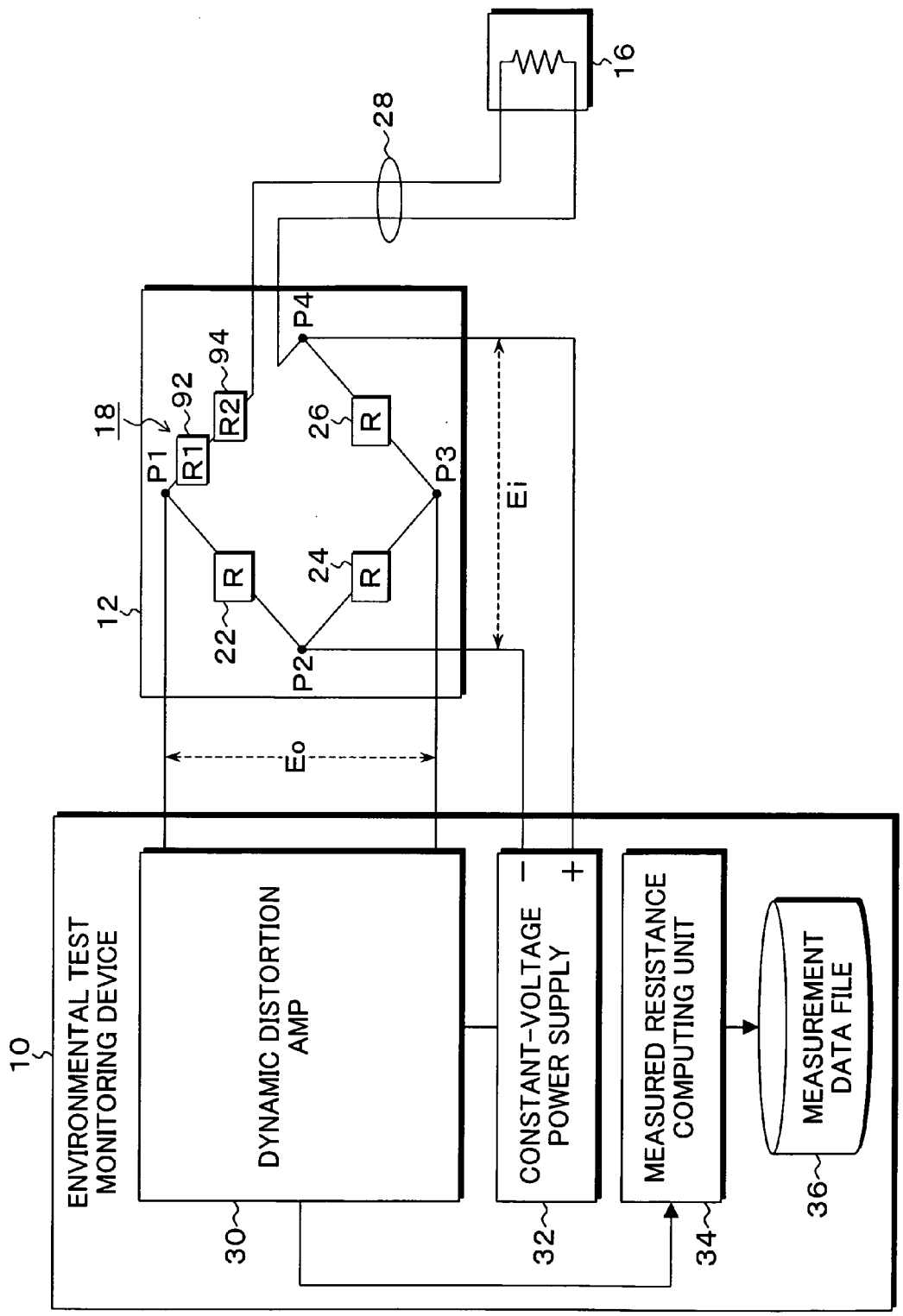
FIG. 14 is an explanatory diagram of another embodiment using divided resistances having positive and negative temperature coefficients as fixed reference resistances.

FIG. 14 is an explanatory diagram of another embodiment using divided resistances having positive/negative temperature coefficients instead of the distortion gauge 20 which is housed in the shielding box 14 in the previous embodiments as a fixed reference resistance of the Wheatstone bridge circuit 18. In FIG. 14, in the Wheatstone bridge circuit 18 of the present embodiment, a first resistance 92 and a second resistance 94 which are divided into two as the fixed reference resistance are connected in series on the bridge side of the bridge connection points P1 and P4, and the sample 16 is connected thereto by the cable 28. Regarding the first resistance 92 and the second resistance 94 constituting the fixed reference resistance, the first resistance 92 has a negative resistance temperature coefficient, meanwhile, the second resistance 94 has a positive resistance temperature coefficient. Equivalent values are used as the values of the resistance temperature coefficients of the first resistance 92 and the second resistance 94. When the first resistance 92 and the second resistance 94 constituting the fixed reference resistance are provided with the resistance temperature coefficients having the same value and opposite positive/negative polarities, variation of the first resistance 92 and the second resistance 94 dependant on temperatures with respect to variation in outside air temperature becomes resistance variation which is alternately inverse in the negative direction for the first resistance 92 and the positive direction for the second resistance 94, and the variation amount is equivalent with respect to the temperature; therefore, when the resistance values of the first resistance 92 and the second resistance 94 are R1 and R2, respectively, the fixed reference resistance (R1+R2) in which both of them are added to each other can be always maintained to a constant value with respect to the temperature. Therefore, influence of the outside air temperature has to be blocked when the distortion gauge 20 is used as the fixed reference resistance in the embodiment of FIG. 4 by housing the distortion gauge 20 in the shielding box 14 as shown in FIG. 6; however, in the present embodiment, since variation is not caused by the temperature in the fixed reference resistance, i.e., the series resistance of the first resistance 92 and the second resistance 94(R1+R2), the first resistance 92 and the second resistance 94 are not required to be housed in the shielding box 14 shielding the external air, and they are merely required to be housed in the bridge box 12 having a simple structure which is shielded such that external force is not applied thereto. Therefore, corresponding to the degree that shielding box 14 housing the distortion gauge 20 is not required, the device structure can be simplified, and the cost can be reduced. Herein, specific examples of the first resistance 92 and the second resistance 94 constituting the fixed reference resistance will be described as the following. First of all, when the resistance value of the first resistance 92 having a negative resistance temperature coefficient is R1, for example, a tantalum nitride resistor can be used, and the resistance temperature coefficient ΔR1 thereof is ΔR1=−30.9 ppm/° C. When the resistance value of the second resistance 94 having a positive resistance temperature coefficient is R2, a nichrome resistor can be used, and the resistance temperature coefficient ΔR2 thereof is ΔR2=100 ppm/° C. Herein, if temperature variation ΔTa is ΔTa=20° C.

the fixed reference resistance value R is R=R1+R2=120 Ω, the resistance values R1 and R2 of the divided first resistance 92 and the second resistance 94 before temperature correction will be as the following.

$$R1 = 120 \times |\Delta R2|/(|\Delta R1| + |\Delta R2|) = 92.30769231 \ \Omega$$

$$R2 = 120 \times |\Delta R1|/(|\Delta R1| + |\Delta R2|) = 27.69230769 \ \Omega$$

Then, when the cancel-out relation of the resistance values R1 and R2 with respect to the temperature is obtained, it will be as the following expression.

$$(\Delta Ta \times \Delta R1 \times R1)+(\Delta Ta \times \Delta R2 \times R2)=0$$

The first term and the second term in the left side will be $$(\Delta Ta \times \Delta R2 \times R2) = 20 \times 100 \times 10^{-6} \times 27.69 = 0.0553846 \ \Omega$$

$$(\Delta Ta \times \Delta R1 \times R1) = 20 \times -30.9 \times 10^{-6} \times 92.31 = -0.05704615 \ \Omega,$$

and the cancel-out result of addition of them will be $$(\Delta Ta \times \Delta R1 \times R1) + (\Delta Ta \times \Delta R2 \times R2) =$$
$$0.05538\ \Omega - 0.057046\ \Omega = 0.001666\ \Omega = -1.67\ \text{m}\Omega.$$

Therefore, the fixed reference resistance value R after temperature variation will be $$R = R1 + \Delta R1 = R2 + \Delta R2 = 120.00167\ \Omega$$

wherein an erroneous variation amount is merely 0.000014%. Furthermore, variation in the fixed reference resistance can be canceled out together with the difference of the wiring resistance. First of all, the trimming accuracy is 0.05% or less when the first resistance 92 and the second resistance 94 are to be formed as thin-film resistors on a ceramic board. Therefore, the variation range of the resistance value R1 of the first resistance 92 will be $$R1 = 92.307 \pm 0.05\% = 92.307 \pm 0.046\ \Omega$$

R1min=92.353 Ω

R1max=92.261 Ω.

Also, the variation range of the resistance value R2 of the second resistance 94 will be $$R2 = 27.692 \pm 0.05\% = 27.692 \pm 0.013\ \Omega$$

R1min=27.706 Ω

R2max=27.679 Ω.

Therefore, the resistance value R of the fixed reference resistance including the individual difference variation of the first resistance 92 and the second resistance 94 will be $$R = R1\text{min} + R2\text{min} = 92.261 + 27.679 = 119.94\ \Omega.$$

wherein the erroneous variation amount can be suppressed to 0.0005%, and sufficient stability as the fixed reference resistance can be ensured. The above described embodiments employed measurement of resistance variation caused by a vibration test of soldered points of a circuit component mounted on a circuit board as an example; however, the present invention is not limited thereto and can be applied to arbitrary use without modification as long as it is measurement of minute resistance variation periodically generated in an arbitrary sample. Moreover, although the above described embodiments employed, as an example, a vibration test as an environmental test; however, they can be applied to arbitrary environmental tests such as a shock test and a thermal shock test other than them without modification. Moreover, the present invention includes arbitrary modifications that do not impair the object and advantages thereof and is not limited by the numerical values shown in the above described embodiments.

What is claimed is:

1. A sample resistance measurement device characterized by having a sample having a resistance component varied by an environmental condition including external force and a temperature;
   a fixed reference resistance having a predetermined resistance value of which variation caused by the environmental condition is suppressed;
   a Wheatstone bridge circuit connecting a first resistance, a second resistance, a third resistance, and a fourth resistance by bridge connection, and is a circuit connecting the first resistance with the fixed reference resistance and the sample in series, wherein resistance values of the second resistance to the fourth resistance are same as the fixed reference resistance;
   a constant-voltage power supply for applying a constant bridge input voltage between a first connection point connecting the first resistance with the fourth resistance and a third connection point connecting the second resistance and the third resistance of the Wheatstone bridge circuit;
   a dynamic distortion amplifier circuit for inputting a bridge output voltage from the part between a second connection point connecting the first resistance and the second resistance and a fourth connection point connecting the third resistance and the fourth resistance of the Wheatstone bridge circuit, and outputting a carrier wave signal of a predetermined frequency varied in accordance with the bridge output voltage; and
   a measured resistance computing unit for detecting the bridge output voltage by sampling a peak level of the carrier wave signal of the dynamic distortion amplifier circuit and calculating resistance of the sample based on the detected bridge output voltage.

2. The sample resistance measurement device according to claim 1, characterized in that the sample has the resistance component which is varied in the environmental test including a vibration test, a shock test, or a thermal shock test.

3. The sample resistance measurement device according to claim 1, characterized in that the sample is a circuit component mounted by soldering a plurality of pins to a substrate, and resistance of a circuit in which a plurality of soldered points of the circuit component are connected in series serves as a measurement object.

4. The sample resistance measurement device according to claim 1, characterized in that the fixed reference resistance, the Wheatstone bridge circuit, the constant-voltage supply, the dynamic distortion amplifier, and the measured resistance computing unit are disposed in the side of an environmental test monitoring device, and a measurement probe having two signal lines connected to the sample loaded in the side of an environmental tester is lead from the side of the environmental test monitoring device.

5. The sample resistance measurement device according to claim 1, characterized in that the fixed reference resistance is a distortion gauge having a resistance value same as each of the first to third resistances.

6. The sample resistance measurement device according to claim 5, characterized in that the distortion gauge is housed in a container having a heat insulating structure and a sealed structure in a state in which the distortion gauge is fixed to and disposed on a base substrate having an equivalent thermal expansion coefficient.

7. The sample resistance measurement device described in claim 1, characterized in that the fixed reference resistance is comprised of two divided resistors connected in series, and one of the resistors is composed of a first resistance material having a positive temperature coefficient, and the other resistor is composed of a second resistance material having a negative temperature coefficient having an equivalent value.

8. The sample resistance measurement device according to claim 7, characterized in that the fixed reference resistance comprised of the two divided resistors connected in series is housed in a container having a sealed structure in a state in which the fixed reference resistance is fixed to and disposed on a base substrate having an equivalent thermal expansion coefficient.

9. The sample resistance measurement device according to claim 1, characterized in that the measured resistance computing unit calculates a resistance $\Delta R$ of the sample as $$\Delta R = \frac{4REo}{Ei - 2Eo},$$

when the resistance of the sample is $\Delta R$, each of the fixed reference resistance and the second to fourth resistances of the Wheatstone bridge is R, the bridge input voltage is Ei, and the bridge output voltage is Eo.

10. The sample resistance measurement device according to claim 1, characterized in that when the sample is a circuit component mounted by soldering a plurality of pins to a substrate, and the resistance of the circuit in which a plurality of soldered points of the circuit component are connected in series serves as a measurement object, the measured resistance computing unit calculates a resistance value caused by generating of a crack in the soldered points of the circuit component.

11. The sample resistance measurement device according to claim 1, characterized in that the measured resistance computing unit calculates a variation amount of the sample resistance value caused by the environmental test.

12. The sample resistance measurement device according to claim 11, characterized in that the measured resistance computing unit calculates the resistance variation amount of the sample by subtracting a no-load resistance component to the sample from the calculated resistance value of the sample.

* * * * *